US00RE36097E

United States Patent [19]

Cha

[11] E Patent Number: Re. 36,097

[45] Reissued Date of Patent: Feb. 16, 1999

[54] SEMICONDUCTOR PACKAGE FOR A SEMICONDUCTOR CHIP HAVING CENTRALLY LOCATED BOTTOM BOND PADS

[75] Inventor: Gi Bon Cha, Cheong-ju, Rep. of Korea

[73] Assignee: LG Semicon, Ltd., Chungcheongbuk-Do, Rep. of Korea

[21] Appl. No.: 748,460

[22] Filed: Nov. 8, 1996

Related U.S. Patent Documents

Reissue of:

[64] Patent No.: 5,363,279
Issued: Nov. 8, 1994
Appl. No.: 970,771
Filed: Nov. 3, 1992

[30] Foreign Application Priority Data

Nov. 14, 1991 [KR] Rep. of Korea ..... 19459/1991

[51] Int. Cl.[6] ..... H01L 23/48

[52] U.S. Cl. ..... 361/773; 361/775; 361/783; 361/813; 438/123; 438/124; 257/691; 257/693; 174/52.4

[58] Field of Search ..... 257/676, 691, 257/692, 693, 787; 437/217, 219, 220; 361/767, 772, 773, 775, 783, 813; 174/52.4; 438/112, 126, 127, 123, 124

[56] References Cited

U.S. PATENT DOCUMENTS

| | | | |
|---|---|---|---|
| 3,940,786 | 2/1976 | Scheingold et al. | 257/773 |
| 4,532,419 | 7/1985 | Takeda | 235/492 |
| 4,539,472 | 9/1985 | Poetker et al. | 235/488 |
| 4,937,656 | 6/1990 | Kohara | 257/676 |
| 5,107,325 | 4/1992 | Nakayoshi | 257/793 |
| 5,122,860 | 6/1992 | Kikuchi et al. | 257/679 |
| 5,157,480 | 10/1992 | McShane et al. | 257/693 |
| 5,166,866 | 11/1992 | Kim et al. | 361/767 |
| 5,172,214 | 12/1992 | Casto | 257/676 |
| 5,229,846 | 7/1993 | Kozuka | 257/678 |
| 5,235,207 | 8/1993 | Ohi et al. | 257/670 |
| 5,436,500 | 7/1995 | Park et al. | 257/696 |
| 5,583,375 | 12/1996 | Tsubosaki et al. | 257/692 |
| 5,693,573 | 12/1997 | Choi | 438/123 |

FOREIGN PATENT DOCUMENTS

| | | | |
|---|---|---|---|
| 0198194 | 10/1986 | European Pat. Off. | H01L 23/48 |
| 0465143 | 1/1992 | European Pat. Off. | H01L 23/498 |
| 0501830 | 9/1992 | European Pat. Off. | H01L 23/495 |
| 3911711 | 10/1990 | Germany | H01L 23/50 |
| 51-16701 | 2/1976 | Japan . | |
| 57-176751 | 10/1982 | Japan | H01L 23/48 |

(List continued on next page.)

OTHER PUBLICATIONS

Goodenough, Frank: "Mixing Gold and Aluminum Bond Wires on Power Ics Cuts Cost and Ups Reliability"; 1990; p. 34; In: Electronic Design, 11, H..19.

Bregmann, Mark F. and Kovac, Carolin A; "Plastic for VLSI-Based Computers"; Jun. 1968, H.6, S.75–80; In: Solid State Technology.

*Primary Examiner*—Leo P. Picard
*Assistant Examiner*—John B. Vigushin
*Attorney, Agent, or Firm*—Loudermilk & Associates

[57] ABSTRACT

A semiconductor package having outer leads which are not protruded from the package but only exposed to outside. The semiconductor package comprises a semiconductor chip which is formed with a plurality of bond pads at a central portion of its bottom surface, a lead frame including leads connected to bond pads for input/output of the bond pads respectively and bus bars connected to power supplying pads of the bond pads, insulation adhesives for attaching inner leads of the leads and inner leads of the bus bars to a bottom surface of the semiconductor chip formed with the bond pads, metal wires for electrically connecting the inner leads of the leads and the inner leads of the bus bars to the bond pads respectively, and a molding compound enveloping the semiconductor chip assembly with outer leads of the lead frame exposed to outside. The adhesive tapes are removed after a molding procedure.

64 Claims, 4 Drawing Sheets

FOREIGN PATENT DOCUMENTS

| | | | |
|---|---|---|---|
| 58-11198 | 1/1983 | Japan | 15/2 |
| 60-15786 | 1/1985 | Japan . | |
| 60-68488 | 4/1985 | Japan . | |
| 60-183745 | 9/1985 | Japan . | |
| 60-257159 | 12/1985 | Japan | H01L 23/48 |
| 61-222715 | 10/1986 | Japan . | |
| 62-2560 | 1/1987 | Japan | H01L 23/48 |
| 62-76540 A | 4/1987 | Japan | 257/693 |
| 62-134944 | 6/1987 | Japan . | |
| 62-154769 | 7/1987 | Japan . | |
| 62-249464 | 10/1987 | Japan | H01L 23/48 |
| 2298146 | 12/1987 | Japan . | |
| 62-298146 A | 12/1987 | Japan | 257/692 |
| 63-67763 A | 3/1988 | Japan | 257/693 |
| 3151058 | 6/1988 | Japan . | |
| 63-151058 | 6/1988 | Japan | H01L 23/50 |
| 63-258050 | 10/1988 | Japan | H01L 23/50 |
| 63-296252 A | 12/1988 | Japan | 257/666 |
| 2-47061 | 3/1990 | Japan | H01L 23/50 |
| 263142 | 3/1990 | Japan | 23/28 |
| 2-246125 | 10/1990 | Japan | H01L 21/60 |
| 3-131059 A | 6/1991 | Japan | 257/692 |
| 3131059 | 6/1991 | Japan | 257/692 |
| 5-166964 A | 7/1993 | Japan | 257/693 |
| 6-132453 A | 5/1994 | Japan | 257/693 |
| 6-236956 A | 8/1994 | Japan | 257/693 |

SEMICONDUCTOR PACKAGE FOR A SEMICONDUCTOR CHIP HAVING CENTRALLY LOCATED BOTTOM BOND PADS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor package, and more particularly to a semiconductor package suitable for packaging a center pad layout-shaped memory chip wherein paddles of a lead frame are removed and outer leads of a lead frame are not protruded from the package but only exposed to a lower surface of molding resin of a semiconductor package.

2. Description of the Prior Art

Generally, semiconductor packages may be mainly classified into a semiconductor of SOP (small outline package) type and a semiconductor of SOJ (small outline J-lead) type.

In this case, the semiconductor packages are manufactured in accordance to following procedures. A semiconductor chip is attached on paddles of a lead frame and then wire bonding is carried out between inner leads of the lead frame and pads on the semiconductor chip. The wire bonded semiconductor and lead frame are molded by molding resin. Thereafter, the resulting product is subjected to deflash, trimming and forming procedures so that outer leads of the lead frame are protruded from the molded resin and then bent into predetermined shape respectively.

Referring to FIGS. 2 and 3, there are shown a front section and a bottom of a semiconductor package of LOC (lead on chip) type. In the semiconductor package shown in FIGS. 2 and 3, a semiconductor chip 3 is formed with a plurality of bond pads 3*a* at central portion thereof. Inner leads 4*a* of a lead frame 4 without paddles are attached on a surface of the semiconductor chip 3 at both sides of the bond pads 3*a* by means of insulation tapes 6. The inner leads 4*a* are electrically connected to the bond pads 3*a* of the semiconductor chip 3 by means of metal wires 7, respectively. Also, power supplying pads of the bond pads 3*a* are electrically connected to bus bars 5 by metal wires 7, respectively. Thereafter, the resulting semiconductor chip 3 and the inner leads 4*a* of the lead frame 4 are molded by molding resin 1.

The above-mentioned prior semiconductor packages are manufactured in such a manner that a semiconductor chip aggregate is subjected to a sawing step for dividing the semiconductor chip aggregate into separate semiconductor chips 3 and the semiconductor chip 3 is subjected to a die bonding step for attaching the separated semiconductor chip 3 to a lead frame 4, a wire bonding step for electrically connecting bond pads 3*a* of the semiconductor chip 3 to inner leads 4*a* of the lead frame 4 respectively, a molding step for enveloping the wire bonded semiconductor chip 3 and lead frame 4, a deflashing step, a solder plating step, a trimming step for cutting dampers of the lead frame 4, a forming step for bending outer leads into a certain shape, and a marking step.

The semiconductor package prepared as described above have outer leads protruded from the mold resin. The outer leads are formed into a certain shape and then mounted on a printed circuit board.

However, the prior semiconductor packages have various disadvantages as follows. The prior semiconductor packages occupy large space due to the outer leads protruded from mold resins when the semiconductor packages are mounted on printed circuit boards.

Since the semiconductor packages have outer mechanical shock when their forming procedure, fine gaps may occur in contact areas between outer leads protruded from package bodies and mold resins, thereby causing humidity resistant property to be deteriorated due to the gaps.

Also, since the semiconductor packages require a trimming step and a forming step after a molding procedure, manufacturing process of the packages becomes complicated so that their manufacturing cost and poor products occurring rate are increased.

In addition, in case of the LOC type of semiconductor packages using lead frames without paddles, electrical property is decreased because of their long length between inner leads and outer leads.

Furthermore, so-called "good rate" which is a rate of good products in products identified as poor packages is increased because of poor lead contacts in testing of finished products.

SUMMARY OF THE INVENTION

Therefore, the present invention is made in view of the above-described prior art problems and an object of the invention is to provide a semiconductor package which is designed to occupy small space required to be mounted on a printed circuit board and to reduce manufacturing cost by omitting manufacturing procedures next to a molding procedure.

Another object of the invention is to provide a semiconductor package which has improved lead conductance and thus electrical property by reducing length between its inner leads and outer leads.

In accordance with the present invention, these object can be accomplished by providing a semiconductor package comprising: a semiconductor chip which is formed with a plurality of bond pads at a central portion of its bottom surface; a lead frame including leads connected to bond pads for input/output of the bond pads respectively and bus bars connected to power supplying pads of the bond pads; insulation adhesives for attaching inner leads of the leads and inner leads of the bus bars to a bottom surface of the semiconductor chip formed with the bond pads; metal wires for electrically connecting the inner leads of the leads and the inner leads of the bus bars to the bond pads respectively; and a molding compound enveloping the semiconductor chip assembly with outer leads of the lead frame exposed to outside.

Since the leads of the invention are shortened in length between their inner leads wire-bonded to the bond pads of the semiconductor chip and their outer leads exposed to outside, it is possible to improve lead conductance in a LOC type of semiconductor package and to radiate easily heat occurring in operation of the chip due to their short leads. Particularly, the semiconductor package is appropriate to package a semiconductor chip of 16-mega-bit DRAM or greater which is formed with bond pads at its central portion.

The leads are bent into a certain shape respectively at their inner leads and the outer leads and then the outer leads are attached to polyimide based adhesive tapes. The inner leads of the leads are attached to a bottom surface of the semiconductor chip via insulating films or insulating paste applied to the bottom surface. The attached lead frame and the semiconductor chip are molded such that the outer leads are not protruded from the molded resin but exposed to outside.

In accordance to the invention as described above, paddles are omitted and the outer leads are not protruded from the package but exposed to outside so that the exposed outer leads can be connected to a connection pattern of a printed circuit board. Since the semiconductor package has not protruded outer leads, space occupied by the package is reduced when the package is mounted on a printed circuit board. Also, it is possible to abbreviate trimming and forming procedures next to a molding procedure in its manufacturing process.

BRIEF DESCRIPTION OF THE DRAWINGS

These and other objects and aspects of the invention will become apparent from the following description of an embodiment with reference to the accompanying drawings in which.

DETAILED DESCRIPTION OF THE PREFERRED EMBODIMENTS

Figure 4:
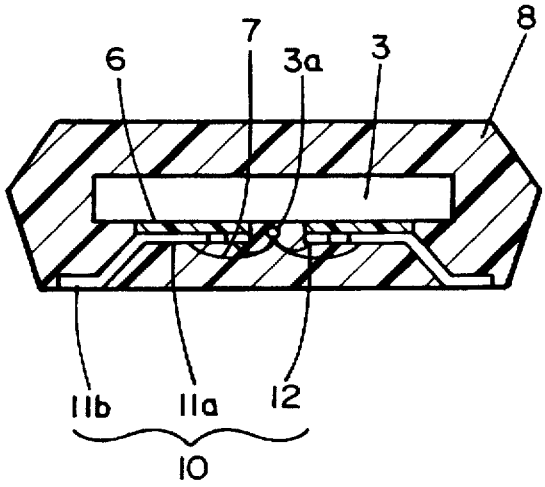
FIG. 4 is a vertical sectional view of a semiconductor package according to the present invention.
Figure 5:
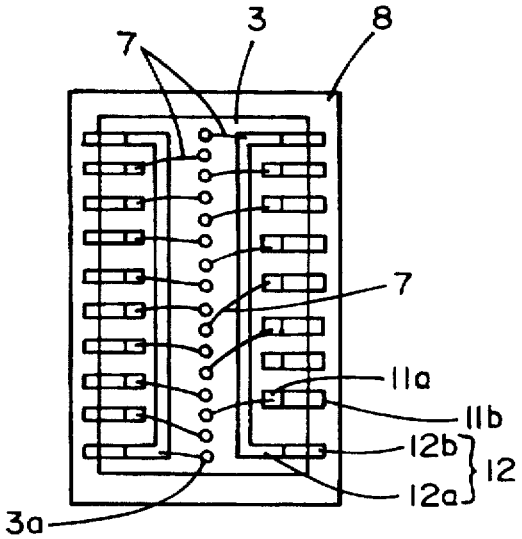
FIG. 5 is a bottom plan view of the semiconductor package shown in FIG. 4, showing its inner construction.

The present invention will now be described by referring to FIGS. 4 to 6 in the accompanying drawings. FIG. 4 shows a vertical section of a semiconductor package according to the present invention and FIG. 5 shows an inner construction of the semiconductor package shown in FIG. 4.

As shown in the drawings, the semiconductor package of the present invention comprises a semiconductor chid 3 which is formed with a plurality of bond pads 3*a* at a central portion of its bottom surface, a lead frame 10 including leads 11 connected to bond pads for input/output of the bond pads 3*a* respectively and bus bars 12 connected to power supplying pads of the bond pads 3*a*, insulation adhesives 6 for attaching inner leads 11 of the leads 11 and inner leads 12*a* of the bus bars 12 to a bottom surface of the semiconductor chip 3 formed with the bond pads 3*a*, metal wires 7 for electrically connecting the inner leads 11*a* of the leads 11 and the inner leads 12*a* of the bus bars 12 to the bond pads 3*a* respectively, and a molding compound 8 enveloping the semiconductor chip assembly with outer leads 11*b* and 12*b* of the lead frame 10 exposed to outside.

Figure 1A:
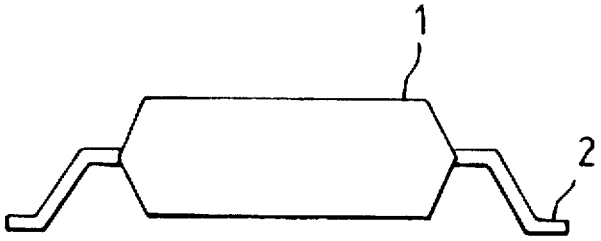
FIG. 1A PRIOR ART
FIG. 1A is a schematic view of a prior SOP type of semiconductor package.
Figure 1B:
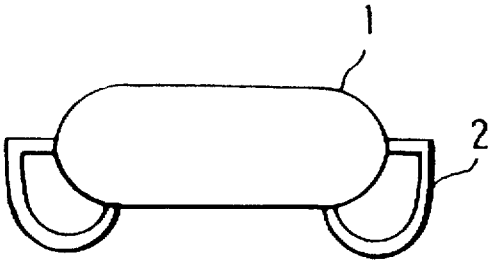
FIG. 1B PRIOR ART
FIG. 1B is a schematic view of a prior SOJ type of semiconductor package.
Figure 2:
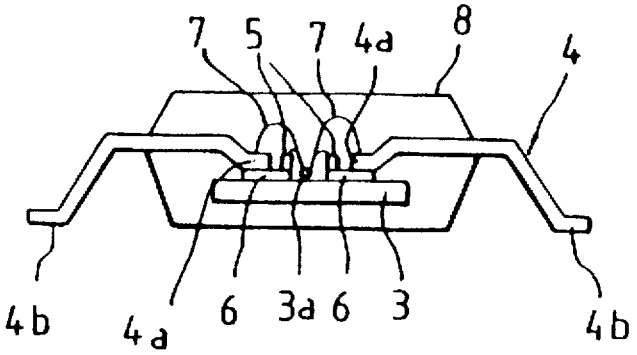
FIG. 2 PRIOR ART
FIG. 2 is a vertical sectional view of a prior LOC type of semiconductor package.
Figure 3:
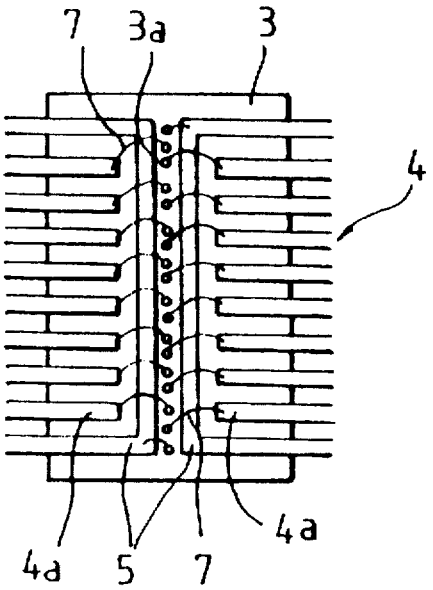
FIG. 3 PRIOR ART
FIG. 3 is a bottom plan view of the semiconductor package shown in FIG. 2, showing its inner construction.

In this description, the substantially identical or similar elements of the semiconductor package of the invention to those of the prior art illustrated in FIGS. 1 to 3 are designated by the similar reference characters.

The plurality of inner leads 11*a*, 12*a* and outer leads 11*b*, 12*b* of the leads 11 and the bus bars 12 are bent into a predetermined shape respectively and arranged in a row. Then, the outer leads 11*b*, 12*b* are attached to adhesive tapes (not shown) at their outer surfaces so that the leads 11 and the bus bars 12 are integrally held. The adhesive tapes, *which may serve as a support during a molding procedure,* are removed after [a] *the* molding procedure.

The lead frame 10 is attached to the semiconductor package 3 in such a manner that insulating adhesives 6 such as insulating films and insulating paste are applied to the bottom surface of the semiconductor chip 3 formed with the bond pads 3*a* and then the inner leads 11*a*, 12*a* of the leads 11 and the bus bars 12 are attached to the insulating adhesives 6.

Also, the leads 11 and the bus bars 12 of the semiconductor package of the present invention are shorter than those of a prior LOC type of semiconductor package in lengths between its inner leads 11*a*, 12*a* and its outer leads 11*b*, 12*b* so that lead conductance is increased when a memory chip of 16-mega-bit DRAM or greater is packaged. In addition, heat occurring in operation of chip can be easily discharged from the short leads.

Figure 6A:
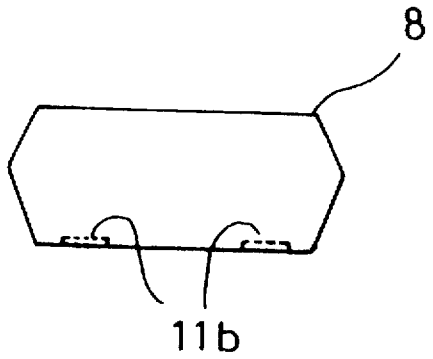
FIG. 6A is a front elevational view of a semiconductor package according to the invention.
Figure 6B:
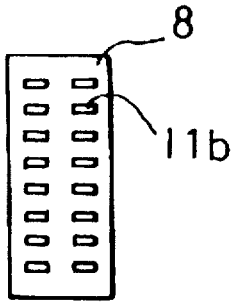
FIG. 6B is a bottom plan view of the semiconductor package shown in FIG. 6A.

FIG. 6A shows a front side of the semiconductor package of the invention and FIG. 6B shows a bottom surface of semiconductor package of the invention. As shown in FIG. 6A, the outer leads 11*b* and 12*b* of the leads 11 and the bus bars 12 are not protruded from the semiconductor package but are flush with the bottom surface of the semiconductor package.

That is, the outer leads 11*b* and 12*b* of the leads 11 and the bus bars 12 are arranged in a row at the bottom surface of the package and faces to outside to be contacted with elements of a printed circuit board, as shown in FIG. 6B. *As shown in FIGS. 4 and 6B, the leads may be elongated and contoured and extend away from the bottom surface, and the exposed portion of the leads may occupy less than a majority portion of the bottom surface.*

A manufacturing process of the semiconductor package as constructed above will be described in detail hereinafter.

First, a semiconductor chip 3 which has been cut separately is applied with insulating adhesive 6 such insulating film and insulating paste at its bottom surface formed with bond pads 3*a*. Inner leads 11*a* and 12*a* of leads 11 and bus bars 12 are attached to the bottom surface of the chid via the insulating adhesive 6 applied to the bottom surface.

Thereafter, the lead frame 10 attached to the semiconductor chip 3 is die-attached in a wire bonder (a wire bonding apparatus) and subjected to a wire bonding procedure for electrically connecting the inner leads 11*a*, 12*a* of the leads 11 and the bus bars 12 to the bond pads 3*a* by metal wires 7 such as gold and aluminum wires.

Subsequently, the resulting semiconductor chip assembly is subjected to a known transfer molding procedure to be enveloped. Then, as adhesive tapes attached to a bottom surface of the molded resin are removed, the outer leads 11*b* and 12*b* of the leads 11 and the bus bars 12 are exposed to outside. Thereafter, as the bottom surface of the molded package and the exposed outer leads are simply removed by a deflash procedure, the manufacturing process of the semiconductor package is completed.

The semiconductor package of the invention as prepared above is mounted on a printed circuit board such that the exposed outer leads 11*b* and 12*b* are connected to a pattern of printed circuit board by a soldering.

As apparent from the above description, the present invention can leave out procedures next to a molding step.

That is, since a prior semiconductor package has outer leads protruded therefrom, a manufacturing process of a prior semiconductor package requires a forming procedure for bending the protruded outer leads and a trimming procedure for cutting dampers of leads. However, since leads according to the invention are attached to adhesive tapes to form an integral lead frame and outer leads of leads are exposed to outside, a manufacturing process of the invention does not require trimming and forming procedures.

Therefore, the present invention has advantages in that since the number of manufacturing steps is significantly reduced, occurrence of poor products and manufacturing cost are reduced.

Also, since the semiconductor package of the invention has not outer leads protruded therefrom; space occupied by the semiconductor package is reduced thereby allowing the packages to be densely mounted when the packages are mounted on a printed circuit board.

In addition, since the semiconductor package of the invention has leads shortened as possible as, it is possible to improve its electrical property and to radiate heat easily as compared with prior art.

While prior semiconductor package may have gaps between outer leads and a molded resin due to outer shock applied to the outer leads during trimming and forming procedures, the semiconductor package of the invention has outer leads exposed to out side and does not require trimming and forming procedures so that the outer leads are not shocked. Therefore, the semiconductor package of the invention can prevent gaps from occurring in the contact area and thus improve humidity resistance. Also, since the semiconductor package is tested in state of tip, the test can be precisely carried out without a particular testing socket. That is, "Good rate" can be reduced.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A semiconductor package comprising:

a semiconductor chip with a plurality of bond pads including at least one power supplying bond pad at a central portion of a bottom surface of said semiconductor chip;

a plurality of leads connected to bond pads for input/output of said bond pads, respectively, each of said leads defining an inner lead and an outer lead;

at least one bus bar connected to said at least one power supplying bond pad, said at least one bus bar defining an inner lead and an outer lead;

insulation [adhesives] *adhesive* for attaching said inner leads of each of the leads and said at least one bus bar to said bottom surface of the semiconductor chip;

metal wires for electrically connecting the inner leads of the leads and the at least one bus bar to the bond pads, respectively; and a molding compound [enveloping] *formed completely around* the semiconductor chip[.] and *also formed around* the inner leads and the bus bar with bottom surfaces of said outer leads of the leads and the bus bar exposed to outside on the bottom surface of said molding compound, *wherein the outer leads are flush with the bottom surface of said molding compound.*

2. A semiconductor package according to claim 1, wherein [said] *the outer leads are shaped in a manner to be attachable to* adhesive tapes [are] *comprising* polyimide [based tapes], *wherein the adhesive tapes serve to hold the leads in an integral manner.*

3. A semiconductor package according to claim 1, wherein said adhesive is an insulating film.

4. A semiconductor package according to claim 1, wherein said adhesive is insulating paste.

5. A semiconductor package according to claim 1, wherein said metal wires are gold wires.

6. A semiconductor package according to claim 1, wherein said metal wires are aluminum wires.

*7. A semiconductor package, comprising:*

*a semiconductor chip;*

*a plurality of contoured leads attached to the semiconductor chip with an insulator and having at least a first portion and a second portion, wherein the contoured leads extend away from a bottom surface of the semiconductor package to provide for wire bonding of the leads to the semiconductor chip;*

*connectors electrically connecting the chip to the first portion of the leads; and*

*a molding compound formed completely around the chip and also formed around the connectors and at least the first portion of the leads, wherein the second portion of the leads is exposed to provide electrical connection points, wherein the exposed second portion of the leads is positioned on and flush with the bottom surface of the semiconductor package.*

*8. The semiconductor package of claim 7, wherein the leads are elongated.*

*9. The semiconductor package of claim 7, wherein the semiconductor chip has a length, wherein the leads extend along the length of the semiconductor chip.*

*10. The semiconductor package of claim 7, wherein the semiconductor chip has a major surface on which are formed circuit elements, wherein the leads are attached to the major surface by an insulating adhesive.*

*11. The semiconductor package of claim 10, wherein the leads are attached at a central portion of the major surface.*

*12. The semiconductor package of claim 10, wherein the insulating adhesive comprises an insulating film.*

*13. The semiconductor package of claim 10, wherein the insulating adhesive comprises an insulating paste.*

*14. The semiconductor package of claim 7, wherein at least one of the leads comprises a power supply bus bar.*

*15. The semiconductor package of claim 14, wherein the power supply bus bar is attached to a central portion of the semiconductor chip.*

*16. The semiconductor package of claim 7, wherein the connectors comprise bonding wires.*

*17. The semiconductor package of claim 7, wherein the electrical connection points provide electrical connections for connecting the semiconductor package to a printed circuit board.*

*18. The semiconductor package of claim 7, wherein the exposed second portions of the leads do not extend beyond the bottom surface of the semiconductor package.*

*19. A semiconductor package, comprising:*

*a semiconductor chip;*

*a plurality of contoured leads attached to the semiconductor chip with an insulator and having at least a first portion and a second portion;*

*connectors electrically connecting the chip to the first portion of the leads; and*

*a molding compound formed completely around the chip and also formed around the connectors and at least the first portion of the leads, wherein the second portion of the leads is exposed to provide electrical connection points, wherein the exposed second portion of the leads is positioned on and flush with a bottom surface of the semiconductor package, and wherein the exposed second portion of the leads comprise less than a majority portion of the area of the bottom surface.*

*20. The semiconductor package of claim 19, wherein the leads are contoured to extend away from the bottom surface of the semiconductor package.*

*21. The semiconductor package of claim 19, wherein the leads are elongated and contoured to extend away from the bottom surface of the semiconductor package.*

*22. The semiconductor package of claim 19, wherein the semiconductor chip has a length, wherein the leads extend along the length of the semiconductor chip.*

*23. The semiconductor package of claim 19, wherein the semiconductor device comprises a memory device.*

*24. The semiconductor package of claim 19, wherein the semiconductor chip has a major surface on which are formed circuit elements, wherein the leads are attached to the major surface by an insulating adhesive.*

*25. The semiconductor package of claim 24, wherein the leads are attached at a central portion of the major surface.*

*26. The semiconductor package of claim 24, wherein the insulating adhesive comprises an insulating film.*

*27. The semiconductor package of claim 24, wherein the insulating adhesive comprises an insulating paste.*

*28. The semiconductor package of claim 19, wherein at least one of the leads comprises a power supply bus bar.*

*29. The semiconductor package of claim 28, wherein the power supply bus bar is attached to a central portion of the semiconductor chip.*

*30. The semiconductor package of claim 19, wherein the connectors comprise bonding wires.*

*31. The semiconductor package of claim 19, wherein the electrical connection points provide electrical connections for connecting the semiconductor package to a printed circuit board.*

*32. The semiconductor package of claim 19, wherein the exposed second portions of the leads do not extend beyond the bottom surface of the semiconductor package.*

*33. A semiconductor package, comprising:*

*a semiconductor chip, wherein the semiconductor chip comprises a length;*

*a plurality of contoured leads attached to the semiconductor chip with an insulator and having at least a first portion and a second portion, wherein the leads extend along the length of the semiconductor chip, and wherein the leads do not extend beyond the length of the semiconductor chip;*

*connectors electrically connecting the chip to the first portion of the leads;*

*a molding compound formed completely around the chip and also formed around the connectors and at least the first portion of the leads, wherein the second portion of the leads is exposed to provide electrical connection points, wherein the exposed second portion of the leads is flush with a surface of the semiconductor package.*

*34. The semiconductor package of claim 33, wherein the semiconductor device comprises a memory device.*

*35. The semiconductor package of claim 33, wherein the semiconductor chip has a major surface on which are formed circuit elements, wherein the leads are attached to the major surface by an insulating adhesive.*

*36. The semiconductor package of claim 35, wherein the leads are attached at a central portion of the major surface.*

*37. The semiconductor package of claim 35, wherein the insulating adhesive comprises an insulating film.*

*38. The semiconductor package of claim 35, wherein the insulating adhesive comprises an insulating paste.*

*39. The semiconductor package of claim 33, wherein at least one of the leads comprises a power supply bus bar.*

*40. The semiconductor package of claim 39, wherein the power supply bus bar is attached to a central portion of the semiconductor chip.*

*41. The semiconductor package of claim 33, wherein the connectors comprise bonding wires.*

*42. The semiconductor package of claim 33, wherein the electrical connection points provide electrical connections for connecting the semiconductor package to a printed circuit board.*

*43. The semiconductor package of claim 33, wherein the exposed second portions of the leads are positioned on a bottom surface of the semiconductor package, wherein the exposed second portions of the leads do not extend beyond the bottom surface of the semiconductor package.*

*44. A semiconductor package, comprising:*

*a semiconductor chip, wherein the semiconductor chip has a major surface on which are formed circuit elements;*

*a plurality of contoured leads attached to the semiconductor chip with an insulator and having at least a first portion and a second portion, wherein the leads are attached to the major surface by an insulating adhesive;*

*connectors electrically connecting the chip to the first portion of the leads;*

*a molding compound formed completely around the chip and also formed around the connectors and at least the first portion of the leads, wherein the second portion of the leads is exposed to provide electrical connection points, wherein the exposed second portion of the leads is flush with a surface of the semiconductor package.*

*45. The semiconductor package of claim 44, wherein the semiconductor chip has a length, wherein the leads extend along the length of the semiconductor chip.*

*46. The semiconductor package of claim 44, wherein the semiconductor device comprises a memory device.*

*47. The semiconductor package of claim 44, wherein the leads are attached at a central portion of the major surface.*

*48. The semiconductor package of claim 44, wherein the insulating adhesive comprises an insulating film.*

*49. The semiconductor package of claim 44, wherein the insulating adhesive comprises an insulating paste.*

*50. The semiconductor package of claim 44, wherein at least one of the leads comprises a power supply bus bar.*

*51. The semiconductor package of claim 50, wherein the power supply bus bar is attached to a central portion of the semiconductor chip.*

*52. The semiconductor package of claim 44, wherein the connectors comprise bonding wires.*

*53. The semiconductor package of claim 44, wherein the electrical connection points provide electrical connections for connecting the semiconductor package to a printed circuit board.*

*54. The semiconductor package of claim 44, wherein the exposed second portions of the leads are positioned on a bottom surface of the semiconductor package, wherein the exposed second portions of the leads do not extend beyond the bottom surface of the semiconductor package.*

*55. A semiconductor package, comprising:*

*a semiconductor chip;*

*a plurality of contoured leads attached to the semiconductor chip with an insulator and having at least a first portion and a second portion, wherein at least one of the leads comprises a power supply bus bar;*

*connectors electrically connecting the chip to the first portion of the leads;*

*a molding compound formed completely around the chip and also formed around the connectors and at least the first portion of the leads, wherein the second portion of the leads is exposed to provide electrical connection points, wherein the exposed second portion of the leads is flush with a surface of the semiconductor package.*

*56. The semiconductor package of claim 55, wherein the semiconductor device comprises a memory device.*

*57. The semiconductor package of claim 55, wherein the semiconductor chip has a major surface on which are formed circuit elements, wherein the leads are attached to the major surface by an insulating adhesive.*

*58. The semiconductor package of claim 57, wherein the leads are attached at a central portion of the major surface.*

*59. The semiconductor package of claim 57, wherein the insulating adhesive comprises an insulating film.*

*60. The semiconductor package of claim 57, wherein the insulating adhesive comprises an insulating paste.*

*61. The semiconductor package of claim 55, wherein the power supply bus bar is attached to a central portion of the semiconductor chip.*

*62. The semiconductor package of claim 55, wherein the connectors comprise bonding wires.*

*63. The semiconductor package of claim 55, wherein the electrical connection points provide electrical connections for connecting the semiconductor package to a printed circuit board.*

*64. The semiconductor package of claim 55, wherein the exposed second portions of the leads are positioned on a bottom surface of the semiconductor package, wherein the exposed second portions of the leads do not extend beyond the bottom surface of the semiconductor package.*

* * * * *